United States Patent [19]

Iwane

[11] Patent Number: 5,212,814
[45] Date of Patent: May 18, 1993

[54] AUTOMATIC OUTPUT POWER CONTROLLER

[75] Inventor: Yasushi Iwane, Hyogo, Japan

[73] Assignee: Mitsubishi Denki Kabushiki Kaisha, Tokyo, Japan

[21] Appl. No.: 686,986

[22] Filed: Apr. 18, 1991

[30] Foreign Application Priority Data

Jul. 4, 1990 [JP] Japan ................... 2-176771

[51] Int. Cl.$^5$ .................... H04B 1/02; H04B 1/04; H03G 3/00
[52] U.S. Cl. .................... 455/107; 455/126; 330/127; 330/149
[58] Field of Search ............... 330/127, 129, 149, 141, 330/279, 281; 455/38.3, 116, 126, 127, 107, 136, 89; 375/71; 358/174

[56] References Cited

U.S. PATENT DOCUMENTS

| | | | |
|---|---|---|---|
| 4,412,337 | 10/1983 | Bickley et al. | 455/126 |
| 4,700,151 | 10/1987 | Nagata | 455/126 |
| 4,760,587 | 7/1988 | Ehlinger et al. | 455/126 |
| 4,811,421 | 3/1989 | Havel et al. | 455/126 |
| 5,054,116 | 10/1991 | Davidson | 455/126 |
| 5,125,100 | 6/1992 | Katznelson | 455/126 |

FOREIGN PATENT DOCUMENTS 2201310 8/1988 United Kingdom .

Primary Examiner—Reinhard J. Eisenzopf
Assistant Examiner—Lisa D. Charouel
Attorney, Agent, or Firm—Rothwell, Figg, Ernst & Kurz

[57] ABSTRACT

An automatic output power controller controls signals output by an amplifier amplifying a modulated wave with its envelope varying due to the modulation so that the mean power becomes constant. An equi-output point extraction circuit extracts timing of the output power of the amplifier becoming a constant value from a base band signal or the like, and supplies the timing to a sample-and-hold circuit. The sample-and-hold circuit samples and holds the output power. Difference between the sample-and-hold value and the reference value is supplied to an output power adjusting circuit, and the output power adjusting circuit controls signals output by the amplifier in accordance with the difference so that the mean power becomes constant.

9 Claims, 4 Drawing Sheets

AUTOMATIC OUTPUT POWER CONTROLLER

BACKGROUND OF THE INVENTION

1. Field of the Invention

The present invention relates to an automatic output power controller wherein signals modulated by a base band signal accompanied by variation of amplitude are output in gain adjustment so that mean power of output signals of an amplifier amplifying the modulated signals becomes constant.

2. Description of the Prior Art

FIG. 1 is a block diagram showing an automatic output power controller in the prior art. In FIG. 1, numeral 1 designates a base band signal, numeral 2 designates an oscillator for generating a carrier 2a, numeral 3 designates a modulator, numeral 4 designates a high frequency signal (hereinafter referred to as "RF signal") being a modulated wave, numeral 5 designates an RF power amplifier with a gain adjusting terminal, numeral 6 designates an amplifier RF output signal, numeral 7 designates an RF output power detector using a coupler and a diode, numeral 8 designates a differential amplifier as voltage difference output means for comparing a detected value with reference voltage, numeral 9 designates a low pass filter (hereinafter referred to as "LPF"), a numeral 10 designates a feedback control signal.

Next, operation will be described.

A carrier 2a is subjected to prescribed modulation by a base band signal 1 in a modulator 3. A modulated wave 4 obtained in this manner is input to an RF power amplifier 5, and is amplified to the required power for transmission. The transmission power must be within a definite allowable range even when source voltage, input power or the like is varied. Consequently, the output power must be always detected and feedback must be applied so as to suppress the variation. In this case, first, the power of the output signal 6 is detected as voltage by an RF output power detector 7 comprising a coupler and a PIN diode as above described, and difference between the detected voltage and the reference voltage is obtained in a differential amplifier 8. The difference signal obtained in this manner passes through an LPF 9 in order to improve the noise resistant property and to remove influence of the amplitude variation attendant upon the modulation and is made a feedback control signal 10. The feedback control signal 10 is applied to the gain adjusting terminal of the RF power amplifier 5. The RF power amplifier 5 increases the gain when the output level as a whole falls, and decreases the gain when the output level rises, so that the output of constant level can be obtained.

Since the automatic output power controller in the prior art is constituted as above described, when a modulated wave accompanied by large amplitude variation is a control object, namely, when envelope of the modulated wave is not constant, a wide dynamic range is required for each component on the feedback loop. Also the time constant of the LPF 9 in the feedback loop must be made significantly large so as to remove influence due to the modulation and to control the mean power. Consequently, problems exist in that rapid rise of the transmission output required for burst mode transmission or the like in the TDMA system cannot be dealt with easily.

SUMMARY OF THE INVENTION

In view of the above-mentioned problems in the prior art, an object of the invention is to provide an automatic output power controller, wherein even when a modulated wave accompanied by large amplitude variation is a control object, mean power can be controlled to be constant without widening the dynamic range of the loop and without enlarging the time constant of the LPF in the feedback loop.

An automatic output power controller according to the invention comprises a high frequency output power detector for detecting output signals of a high frequency power amplifier, a sample-and-hold circuit for sampling the output power detected by the high frequency output power detector in given timing and for holding the sampled power to next sample point, a voltage difference output means for comparing the voltage subjected to sample-and-holding in the sample-and-hold circuit with reference voltage and for outputting difference between them, a low pass filter for smoothing the voltage difference output by the voltage difference output means, an output power adjusting means for adjusting the output power in response to the output of the low pass filter, and an equi-output point extraction means for extracting timing to obtain constant output based on the base band signal or a phase signal set by a switch group and for outputting the extracted timing as a sample timing signal of the sample-and-hold circuit.

The equi-output point extraction means in the invention supplies only timing to obtain specific output power among the modulated wave with amplitude varying by the modulation to the sample-and-hold circuit, and the sample-and-hold circuit samples and holds the detected value in this timing. Therefore substantially constant value eliminating the variation attendant upon the modulation is input to the differential amplifier amplifying difference between the detected output value and the reference level and to the LPF at rear stage thereof. Consequently, even if envelope of the modulated wave is not constant, the time constant of the LPF can be made small similarly to the case that the constant envelope modulation is performed, and the rapid rise of the output is enabled. Also the dynamic range of the differential amplifier and the LPF can be constituted similarly to the case that the constant envelope modulation is performed.

DETAILED DESCRIPTION OF PREFERRED EMBODIMENTS

An embodiment of the invention will be described referring to the accompanying drawings as follows.

Figure 2:
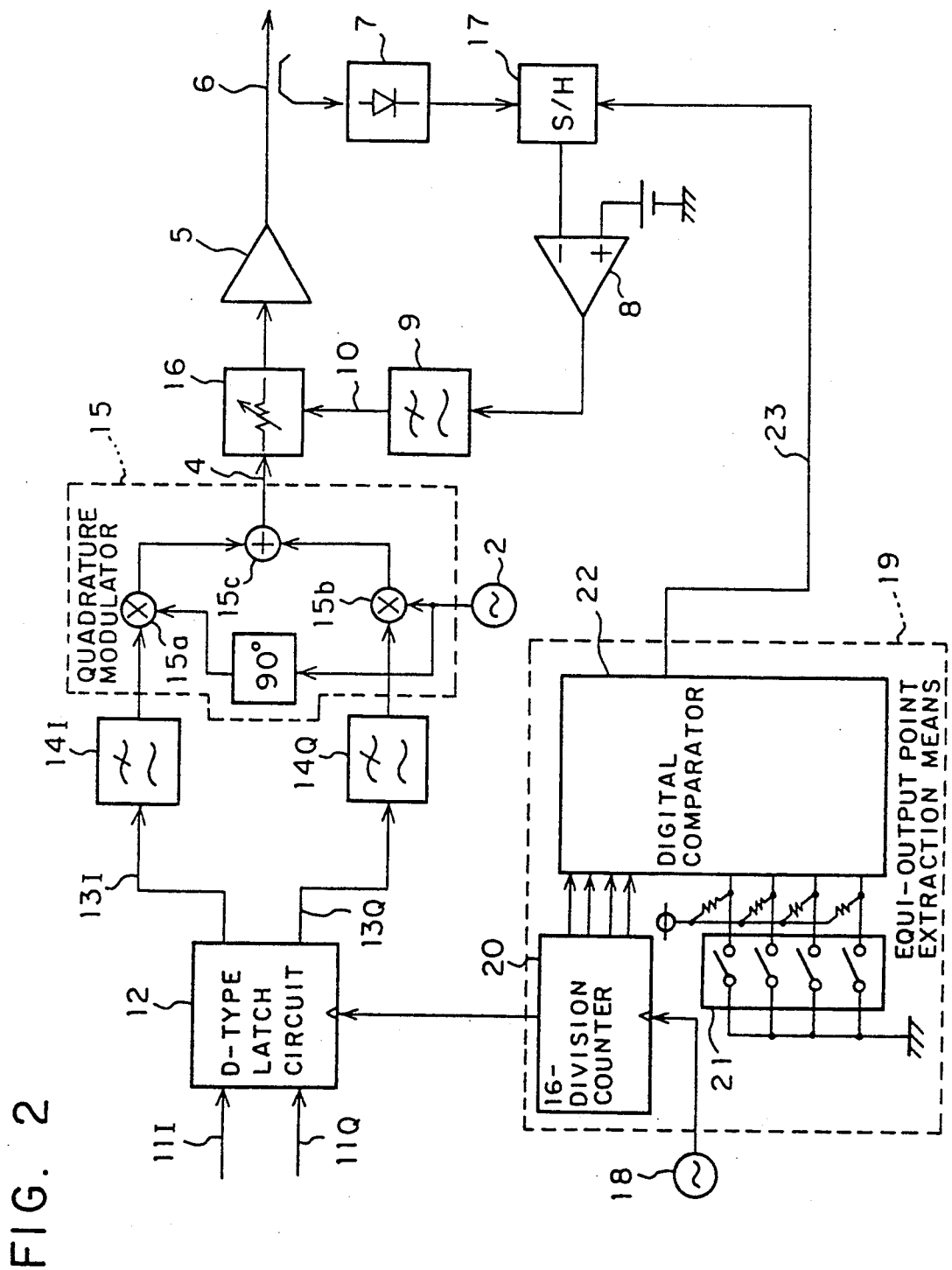
FIG. 2 is a block diagram showing an automatic output power controller as an embodiment of the invention.

In FIG. 2, numerals 11I, 11Q designate non-return to zero signals (hereinafter referred to as "NRZ signals") corresponding to I channel and Q channel respectively, numeral 12 designates a D-type latch circuit, numerals 13I, 13Q designate NRZ signals of the I channel and the Q channel being latched, numerals 14I, 14Q designate Nyquist filters for the band limitation, numeral 15 designates quadrature modulator, numeral 2 designates an oscillator for generating a carrier 2a, numeral 4 designates an RF signal subjected to modulation by QPSK, numeral 16 designates a variable attenuator where attenuation amount is controlled by voltage or current, numeral 5 designates an RF power amplifier, and numeral 6 designates an amplified RF output signal. Numeral 18 designates a clock generator for generating clocks with rate of 16 times as large as symbol rate, numeral 19 designates an equi-output point extraction means, numeral 20 designates a 16-division counter, numeral 21 designates a switch group for previously setting values of four bits, numeral 22 designates a digital comparator for inputting a value of the counter 20 as one input and a value determined by the switch 21 as other input and for comparing both inputs, and a sample timing signal 23 is output at coincident state of each value in the digital comparator and becomes output of the equi-output point extraction means 19. Also numeral 7 designates an RF output power detector, a sample-and-hold circuit 17 samples output of the RF output power detector 7 in timing of the sample timing signal 23 and holds the sampled output, a differential amplifier 8 as voltage difference output means inputs the output of the sample-and-hold circuit 17 and the reference voltage, numeral 9 designates an LPF, and numeral 10 designates a feedback control signal input to the variable attenuator 16.

Next, operation will be described.

First, input NRZ signals 11I, 11Q of two system are latched in prescribed symbol rate in a D-type latch circuit 12. The latched NRZ signals 13I, 13Q are subjected to the band limitation by Nyquist filters 14I, 14Q respectively, and are input to a quadrature modulator 15. In the quadrature modulator 15, a carrier 2a and an output value of the Nyquist filter 14Q are multiplied by a multiplier 15b, and a 90° phase-shifted signal of the carrier 2a and an output value of the Nyquist filter 14I are multiplied by a multiplier 15a, and both outputs of the multipliers 15a, 15b are added in an adder 15c, thus the adding result becomes a modulated RF signal 4 being QPSK signal of the RF band. The modulated RF signal 4 is controlled in level by a variable attenuator 16 controlled by a loop as hereinafter described, and then is amplified by an RF power amplifier 5 to the power required for the transmission and is output as an RF output signal 6.

The QPSK is a phase modulation system, and when the band limitation system, envelope of the QPSK signal is varied significantly. However, in the embodiment where the Nyquist filter is used as a base band filter for the band limitation, so-called Nyquist points where intersymbol interference becomes zero, exist at regular intervals in each symbol interval, and constant amplitude is always output in each Nyquist point. Consequently, if output power detected values are sampled in timing synchronized with the Nyquist points, the mean power can be known without affected by the modulation. In the embodiment, the equi-output point extract means 19 forms clocks synchronized with the Nyquist points. That is, the clock generator 18 outputs clocks with rate of 16 times as large as the symbol rate, and frequency dividing of the clocks is performed by the 16-division counter 20. The carry output of the counter 20 acts as the clock of the D-type latch circuit 12 and latches the NRZ signal. At the same time, the count value of the counter 20 is input to the digital comparator 22. Other input of the digital comparator 22 is supplied with value of four bits previously set by the switch group 21, and the digital comparator 22 makes the sample timing signal 23 H level only when the value of the counter 20 is coincident with the set value by the switch 21. Thus a pulse signal synchronized with the transmission of the symbol and having the stationary phase set by the switch 21 and width of T/16 (T: symbol interval) is output as the sample timing signal 23 from the equi-output point extraction means 19. In consideration of the transfer delay time from the D-type latch circuit 12 to the RF power amplifier 5, if the phase is set using the switch group 21 so that timing of the sample timing signal 23 becoming H level corresponds to the Nyquist point in the RF output signal 6, the sample timing signal 23 realizes the Nyquist point, i.e., the timing where the constant output is expected.

Figure 1:
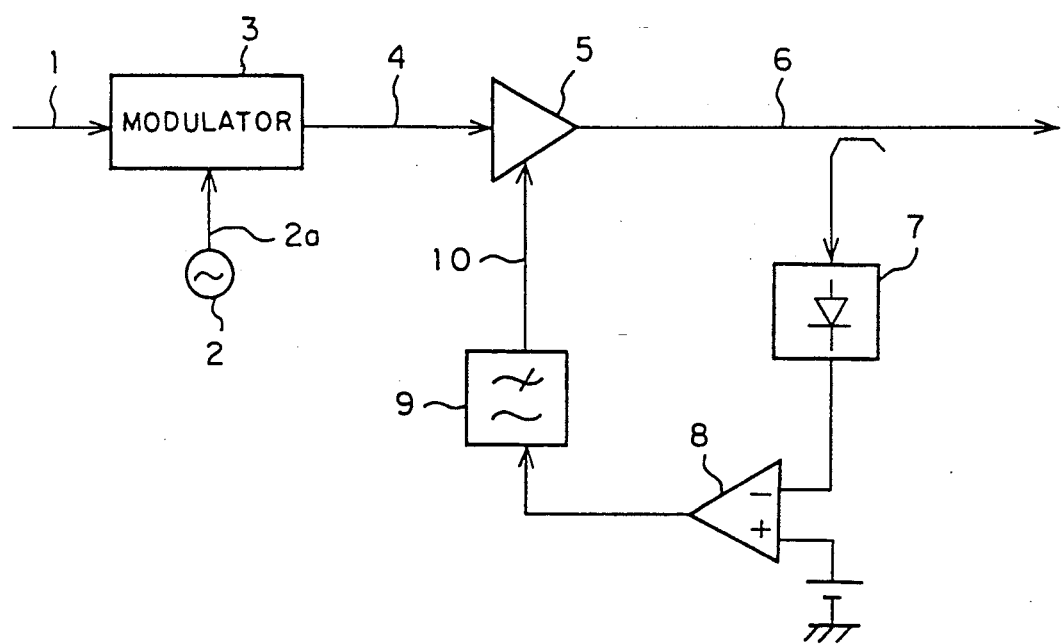
FIG. 1 is a block diagram showing an automatic output power controller in the prior art.

In the feedback loop including the sample-and-hold circuit using the sample timing signal 23, first, level of the RF output signal 6 is detected by the RF output power detector 7 in similar manner to the prior art. The detected level is sampled in the sample-and-hold circuit 17 using the sample timing signal 23, i.e., at the Nyquist point, and is held to next Nyquist point. Consequently, the output of the sample-and-hold circuit 17, i.e., the input of the differential amplifier 8 compared with the reference voltage includes only the mean power and the outer disturbance such as noise being not accompanied by the level variation due to the modulation. Then the differential amplifier 8 determines difference between the mean power and the reference value, and supplies the difference as the feedback control signal 10 through the LPF 9 to the variable attenuator 15 in similar manner to the prior art. However, since the LPF 9 need not remove the variation component attendant upon the modulation, the time constant can be set small. Also since the differential amplifier 8 and the LPF 9 need not follow the variation attendant upon the modulation, such a wide dynamic range, as required in the prior art, becomes unnecessary. The feedback control signal 10 is fed back to the gain adjusting input provided in the RF power amplifier 5 in FIG. 1 explaining the prior art, but it is fed back to the variable attenuator 16 provided before the RF power amplifier 5 in the embodiment. In this case, when the mean output power increases, the attenuation amount becomes large, and when the mean output power decreases, the attenuation amount becomes small, so that the mean output power is held constant. Although the embodiment has been described in the case using the clock generator 18 outputting clock with rate of 16 times as large as the symbol rate and the 16-division counter 20, the clock rate and the frequency dividing ratio may be value other than 16.

Figure 3:
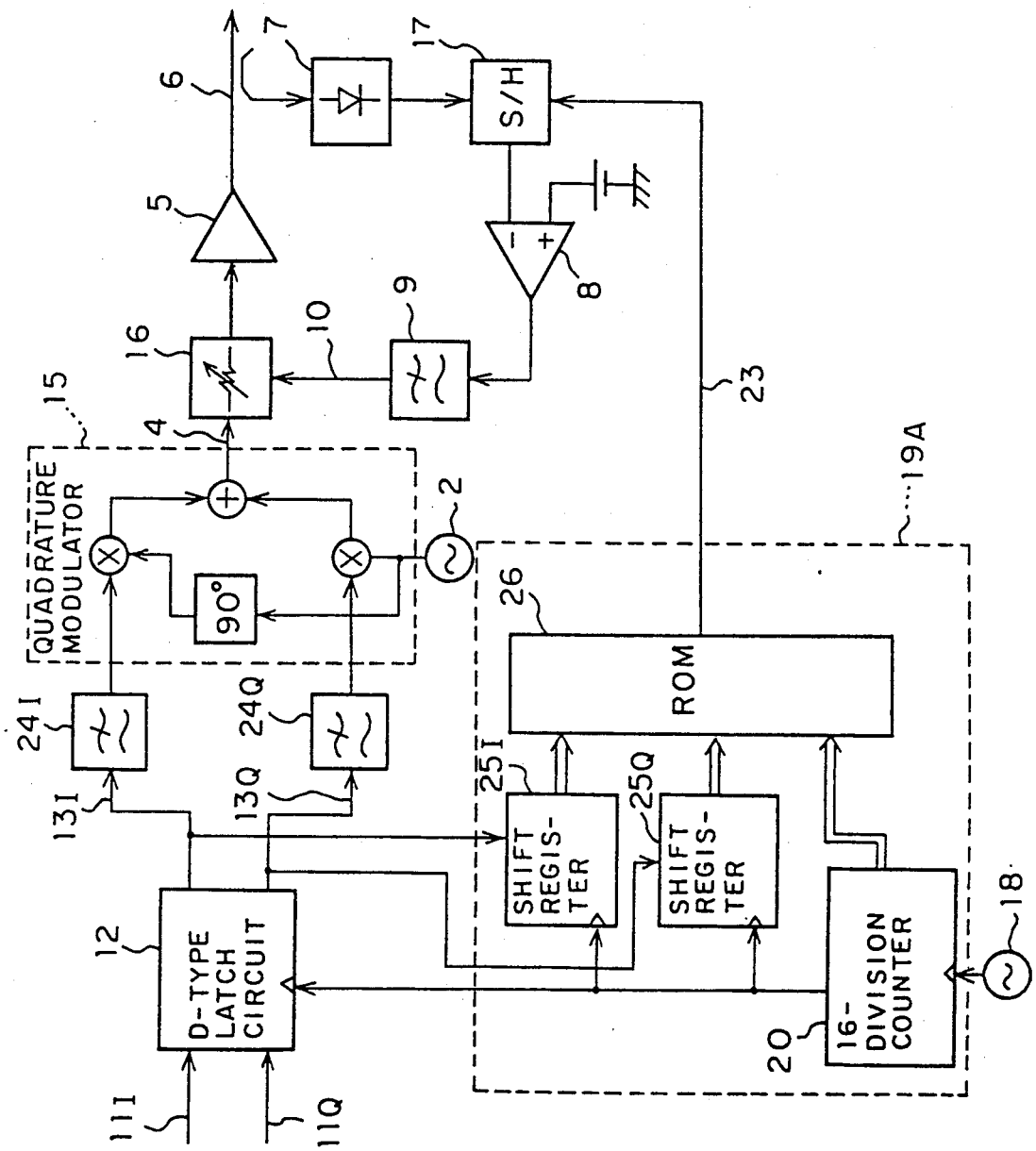
FIG. 3 is a block diagram showing an automatic output power controller as another embodiment of the invention.

FIG. 3 shows another embodiment of the invention. The embodiment is applied to the QPSK subjected to the band limitation by a filter other than the Nyquist filter (for example, the root Nyquist filter, the Gaussian filter or the like). The embodiment is different from the first embodiment in constitution of the base band LPF for the band limitation and the equi-output point extraction means. That is, numerals 24I, 24Q designate base band LPFs for the band limitation in the I channel and the Q channel respectively, 25I, 25Q designate shift registers, and a read only memory (hereinafter referred to as "ROM") 26 receives parallel outputs of the shift registers 25I, 25Q and output of the counter 20 as address inputs and outputs the sample timing signal 23.

Next, operation of the equi-output point extraction means 19A being different from the equi-output point extraction means 19 of FIG. 2 will be described. When the band limitation filter is not the Nyquist filter, the point where the intersymbol interference is zero as shown in the first embodiment, i.e., so-called Nyquist point does not exist. However, in the digital modulation such as the QPSK system, since only signals of discrete and limited values (two values I, Q in the QPSK) are input, outputs of the base band LPFs 24I, 24Q can be all determined from combination in the time series of the latched NRZ signals 13I, 13Q and the transfer function of the base band LPFs 24I, 24Q. Also when the impulse response of the base band LPFs 24I, 24Q is stopped in length obtaining sufficient accuracy, sorts of the obtained waveforms after the filter becomes the finite number. Consequently, these waveforms of the finite number are previously determined by the calculation, and it is determined regarding each waveform that the output of the RF amplifier 5 becomes specific amplitude in what timing of the waveform, and the timing information in response to respective waveforms is enclosed in the ROM 26. If the information in the ROM 26 is read as the sample timing signal 23 in response to the combination of the time series of input signals, the sampling timing corresponding to the point of the output power detected value becoming the constant level can be generated. In FIG. 3, the shift registers 25I, 25Q store the input base band signal series as combination in the time series. The input data series is first input to the address input of the ROM 26, and the clocks 18 with rate of n times as large as the symbol rate are counted by the n-division counter 20 in similar manner to the circuit of FIG. 2, and the count value is also input to address of the ROM 26. As above described, the timing of obtaining the specific amplitude of the output of the RF amplifier 5 is previously calculated regarding each possible combination of the shift registers 25I, 25Q, and values of the shift registers 25I, 25Q and the counter 20 are made address and data of outputting H level in the timing of the output power detected value becoming specific level and outputting L level in other cases are stored in the ROM 26. In this constitution, even if the Nyquist point does not exist, in response to the combination of the input data stored in the shift registers 25I, 25Q, when the counter 20 is set to value in response to timing of the output power detected value becoming specific value, the sample timing signal 23 becomes H level, and the output detected value is sampled and held at the point of the output becoming constant. Although not shown in FIG. 3, if necessary, the delay element may be inserted in the output of the ROM 26 in consideration of the transfer delay time. Operation of other block portion is similar to that of the first embodiment and therefore the description shall be omitted.

Figure 4:
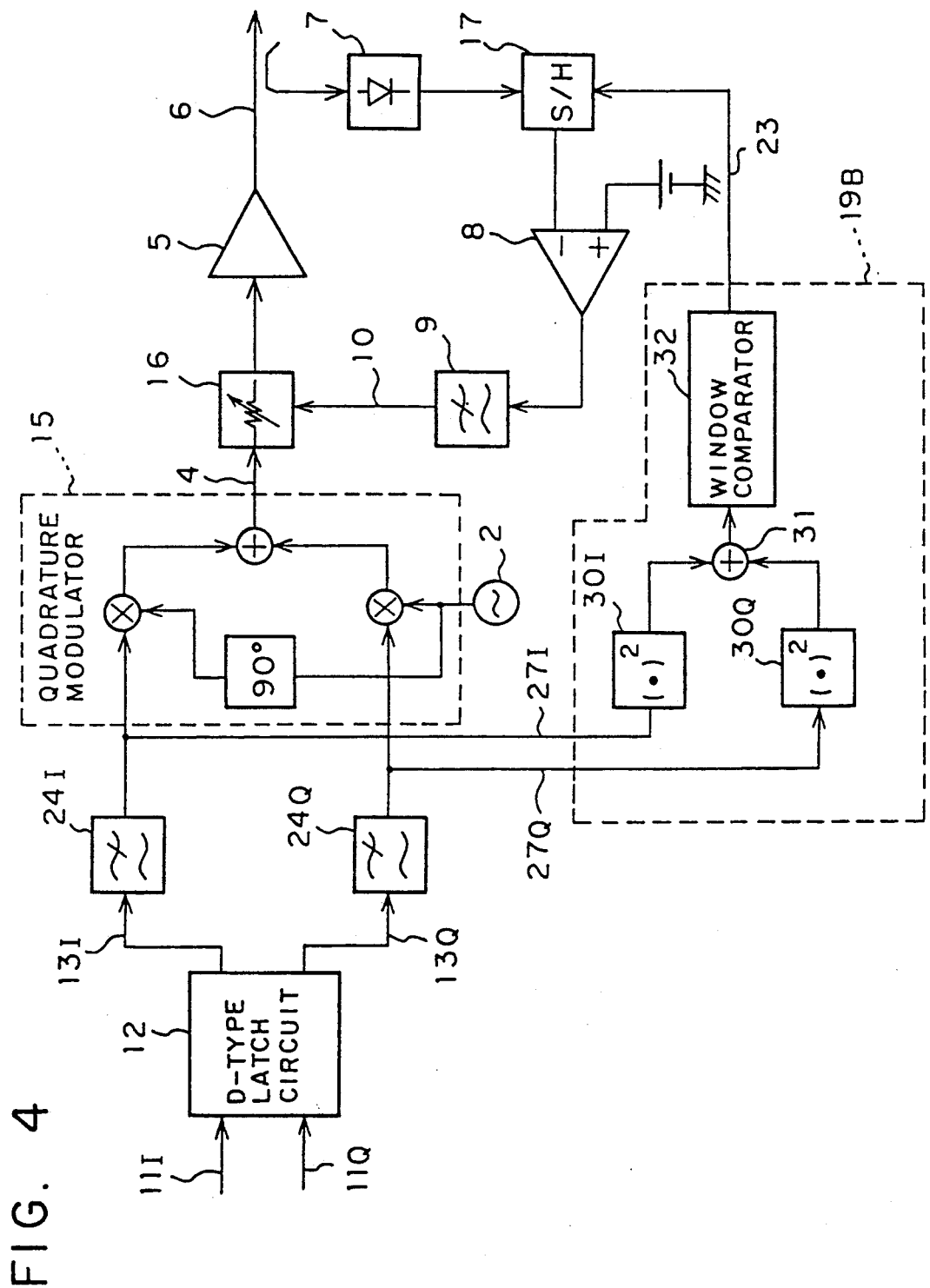
FIG. 4 is a block diagram showing an automatic output power controller as still another embodiment of the invention.

FIG. 4 shows still another embodiment of the invention. The embodiment is also applied to the QPSK in the band limitation. The equi-output point extraction means 19B is constituted by manner other than that of the preceding embodiment. In FIG. 4, numerals 27I, 27Q designate base band signals after the band limitation, square-law circuits 30I, 30Q, where the base band signals is input, output squares of the input signals respectively, an adder 31 takes sum of the square outputs of the square-law circuits 30I, 30Q, and numeral 32 designates a window comparator.

Next, operation of the equi-output point extraction means 19B shown in FIG. 4 will be described. Power after the quadrature modulation, i.e., square of the amplitude is given by sum of squared base band signals in the I channel and the Q channel. Consequently, the base band signals 27I, 27Q are squared in the square-law circuits 30I, 30Q, and the outputs of the square-law circuits 30I, 30Q are added in the adder 31, thereby the power of the RF signals is determined by the base band signals. Next, the signal in the sum of squares is input to a window comparator 32. In the window comparator 32, only when the input is within range of the definite upper limit and lower limit (within the window), the output becomes H level. Consequently, if the output power value being constant is set within the range of the window and the window is set sufficiently narrow, the timing of the constant RF output can be extracted.

In each of the embodiments shown in FIGS. 2-4, although the description has been performed in the case that the QPSK is adopted as the modulation system, other modulation system such as PSK, QAM may be used, and in the embodiment shown in FIG. 4, the analog modulation system may be used.

Also in each of the embodiments shown in FIGS. 2-4, the differential amplifier 8 and the LPF 9 are used, but these may be replaced by an A-D converter, a digital signal processor, and a D-A converter. Since the invention includes the sample-and-hold circuit 17 in principle, it is suitable for such a digital processing.

Further in each of the embodiments shown in FIGS. 2-4, the variable attenuator 16 is used as a feedback control circuit, but the feedback control signal may be fed back to an automatic gain control amplifier, bias of the RF power amplifier 5, the power source or the like.

As above described, according to the invention, since equi-output point of the RF output is extracted by a base band signal or a phase signal set by a switch group, and the RF output detected value is sampled and held in timing of the RF output becoming equal output and the mean output power is controlled, the time constant of the loop filter need not be made large even in the modulation system accompanied by the amplitude variation, and rapid rise of the high-frequency output signal becomes possible. Also since the dynamic range of the sample-and-hold signal is narrow, a cheap element may be used in the differential amplifier or the LPF at the rear stage of the sample-and-holding, and further the gain can be raised and the accuracy can be improved.

What is claimed is:

1. An automatic output power controller wherein gain adjustment of a power amplifier is performed automatically so that the output of the power amplifier amplifying signals modulated by base band signals is held constant, said controller comprising:

an output power detector for detecting the output power of said power amplifier and outputting a voltage in response to the output power so detected;

a sample-and-hold circuit for sampling said voltage in response to the output power detected by said output power detector at selected time intervals and for holding the sampled voltage which is sampled at each time interval to a next sample point at a next time interval;

a voltage difference output means for comparing the voltage sampled-and-held in said sample-and-hold circuit with a selected reference voltage and for outputting the voltage difference between said sampled-and-held voltage and said selected reference voltage;

a low pass filter for smoothing the voltage difference obtained in said voltage difference output means and outputting a feedback control signal which is a function of the smoothed voltage difference;

an output power adjusting means for adjusting the output power in response to the feedback control signal output by said low pass filter; and an equi-output point extraction means for extracting timing at which the output power becomes a constant value based on a phase signal set by a switch group and for outputting the extracted timing as a sample timing signal for determining said selected time intervals of said sample-and-hold circuit.

2. An automatic output power controller as set forth in claim 1, wherein said output power adjusting means is provided with a variable attenuator for attenuating the modulated signal in accordance with the feedback control signal and for supplying the attenuated signal to said power amplifier.

3. An automatic output power controller as set forth in claim 1, wherein the modulated signal is modulated by base band signal which are subjected to band limitation in a Nyquist filter, and said equi-output point extraction means outputs said sample timing signal synchronized with a Nyquist point.

4. An automatic output power controller as set forth in claim 3, wherein said equi-output point extraction means is provided with a counter for counting clocks with rates of n times (n: integer) as large as a symbol rate of the modulating signal, and a comparator for comparing value corresponding to the Nyquist point set by the switch group with the count value of said counter and for outputting said sample timing signal when both the count value and the value corresponding to the Nyquist point are coincident.

5. An automatic output power controller wherein gain adjustment of a power amplifier is performed automatically so that the output of the power amplifier amplifying signals modulated by base band signals is held constant, said controller comprising:

an output power detector for detecting the output power of said power amplifier and outputting a voltage in response to the output power so detected;

a sample-and-hold circuit for sampling said voltage in response to the output power detected by said output power detector at selected time intervals and for holding the sampled voltage which is sampled at each time interval to a next sample point at a next time interval;

a voltage difference output means for comparing the voltage sampled-and-held in said sample-and-hold circuit with a selected reference voltage and for outputting the voltage difference between said sampled-and-held voltage and said selected reference voltage;

a low pass filter for smoothing the voltage difference obtained in said voltage difference output means and outputting a feedback control signal which is a function of the smoothed voltage difference;

an output power adjusting means for adjusting the output power in response to the feedback control signal outputted by said low pass filter; and an equi-output point extraction means for extracting the timing at which output power becomes a constant value from the base band signal and for outputting the extracted timing as a sample timing signal for determining said selected time intervals of said sample-and-hold circuit.

6. An automatic output power controller as set forth in claim 5, wherein said output power adjusting means is provided with a variable attenuator for attenuating the modulated signal in accordance with the feedback control signal and for supplying the attenuated signal to said power amplifier.

7. An automatic output power controller as set forth in claim 5, wherein the modulated signal is modulated by base band signals subjected to band limitation in low pass filters.

8. An automatic power controller as set forth in claim 7, wherein said equi-output point extraction means is provided with a shift register for shifting the base band signal in synchronization with a symbol rate of the modulating signal, a counter for counting clocks with rates of n times (n: integer) as large as the symbol rate of the modulating signal, and a ROM for storing timing information as to the time intervals where the output power becomes a constant value as previously determined from the combination of the time series of the base band signal and the transfer functions of said low pass filters, said ROM being connected to receive parallel values of said shift register and the count value of said counter as read addresses for outputting said timing information as said sample timing signal.

9. An automatic output power controller as set forth in claim 5, wherein the modulating signal is an I-channel base band signal and a Q-channel base band signal each of which is subjected to band limitation in a low pass filter respectively for the modulation of a modulated signal by quadrature modulation, and said equi-output point extraction means is provided with square-law circuits for calculating and outputting the square of the I-channel base band signal and the square of the Q-channel base band signal respectively, an adder for adding the outputs of said square-law circuits and for outputting the sum of said square-law circuit outputs, and a window comparator connected to receive the output of said adder for outputting said sample timing signal when the output of said adder is within a preselected upper and lower limit set in said window comparator.

* * * * *